(12) United States Patent
Nakajima

(10) Patent No.: US 6,368,452 B1
(45) Date of Patent: Apr. 9, 2002

(54) PLASMA TREATMENT APPARATUS AND METHOD OF SEMICONDUCTOR PROCESSING

(75) Inventor: Shu Nakajima, Chigasaki (JP)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/608,132

(22) Filed: Jun. 30, 2000

(30) Foreign Application Priority Data

Mar. 31, 2000 (JP) ........................ 2000-099729

(51) Int. Cl.$^7$ ............................ H05H 1/00; H01L 21/00
(52) U.S. Cl. ........................... 156/345; 216/67; 216/68; 438/710; 438/729; 118/723 R; 118/723 I
(58) Field of Search ................ 156/345; 118/723 R, 118/723 E, 723 I; 216/67, 68; 438/710, 729

(56) References Cited

U.S. PATENT DOCUMENTS

| | | |
|---|---|---|
| 4,701,427 A | 10/1987 | Boecker et al. |
| 5,022,979 A * | 6/1991 | Hijikata et al. ............. 156/345 |
| 5,611,955 A | 3/1997 | Barrett et al. |
| 5,904,778 A | 5/1999 | Lu et al. |

* cited by examiner

*Primary Examiner*—Thi Dang
(74) *Attorney, Agent, or Firm*—Burns, Doane, Swecker & Mathis, LLP

(57) ABSTRACT

In a plasma treatment apparatus having a plasma reaction chamber whose internal surface is covered with a plasma protection member, the protection member is constituted by a sintered silicon carbide substrate and a silicon carbide coating thereon. The resistivity of the silicon carbide substrate is increased by addition of boron which could contaminate the chamber if liberated by plasma attack of the sintered silicon carbide substrate. The deposited silicon carbide film has high purity and low resistivity and filament grooves are used to partition the silicon carbide film. The filament grooves minimize deleterious effects on the plasma density distribution in the chamber otherwise caused by generation of eddy currents on the surface of the low resistivity silicon carbide film. In order to avoid liberation of boron as a result of plasma entering the grooves and attacking exposed portions of the silicon carbide substrate, the filament grooves have widths which are smaller than twice the plasma sheath thickness in contact with the protection member.

20 Claims, 1 Drawing Sheet

PLASMA TREATMENT APPARATUS AND METHOD OF SEMICONDUCTOR PROCESSING

FIELD OF THE INVENTION

The present invention relates to a plasma treatment apparatus, and more particularly to a plasma treatment apparatus such as a plasma etching apparatus or a plasma CVD apparatus utilizing plasma.

BACKGROUND OF THE INVENTION

In manufacture of a semiconductor device, there has been often used a dry process in which plasma is utilized in an etching process or a CVD process.

There has been widely known a reactive ion etching by which an etchant gas is led into a vacuum chamber to form a plasma gas and a semiconductor wafer is etched by using generated ions.

An internal surface of the vacuum chamber in such a plasma treatment apparatus is usually coated with and protected by a plasma protection member. As such a plasma protection member, alumina has been conventionally used. When plasma is generated in the vacuum chamber, however, a part of a product such as ions collides with the internal surface of the vacuum chamber, which separates aluminum from alumina to be discharged in the chamber.

That is, when the aluminum is mixed in the plasma, the obtained mixture is led into the wafer as a contaminant.

Further, since the alumina discharges an oxygen gas as well as the aluminum, the oxygen gas mixed in the plasma adversely affects a photoresist or a shape to be formed when etching the wafer.

In order to solve such a problem, there has been proposed use of a protection member made of silicon carbide having a double structure in which a silicon carbide film is deposited on a sintered silicon carbide in place of using alumina as the plasma protection member.

An example of use of the silicon carbide for the plasma protection member is disclosed in Japanese patent laid-open publication No. Hei 10-139547.

However, there occur various problems even if the silicon carbide having such a double structure is used as the plasma protection member on the internal surface of the vacuum chamber.

One problem lies in that a high-frequency induced current for generating the plasma produces an eddy current in the silicon carbide and this eddy current breaks an electromagnetic field, which can cause a defect in a plasma density distribution or heat generation of the internal surface.

SUMMARY OF THE INVENTION

In order to eliminate the above-described problems, it is an object of the present invention to provide a plasma treatment apparatus capable of stably maintaining the state of the plasma in a chamber without discharging a contaminant from a chamber internal surface into the chamber.

The present invention provides a plasma treatment apparatus comprising a plasma reaction chamber having an internal surface covered with a plasma protection member, wherein the protection member is constituted by a sintered silicon carbide to which boron is added to enhance the resistivity and a silicon carbide film, which is deposited on the sintered silicon carbide and has high purity and low resistivity, includes filament grooves which partition the silicon carbide film.

Further, in the plasma treatment apparatus, it is desirable that a width of the filament groove is smaller than twice the thickness of an ion sheath of the plasma which can be generated in the plasma reaction chamber. Furthermore, it is desirable that a thickness of the silicon carbide film is in a range of 0.5 mm to 6 mm. Moreover, adjustment of the boron content of the sintered silicon carbide is desirable in order that the resistivity of the sintered silicon carbide is increased from $10^{2-3}$ $\Omega \cdot$cm to $10^{7-9}$ $\Omega \cdot$cm. It is to be noted that the protection member may be used for an inductively coupled plasma (ICP) window.

DETAILED DESCRIPTION OF THE INVENTION

A preferred embodiment according to the present invention will now be described with reference to the accompanying drawings.

Figure 2:
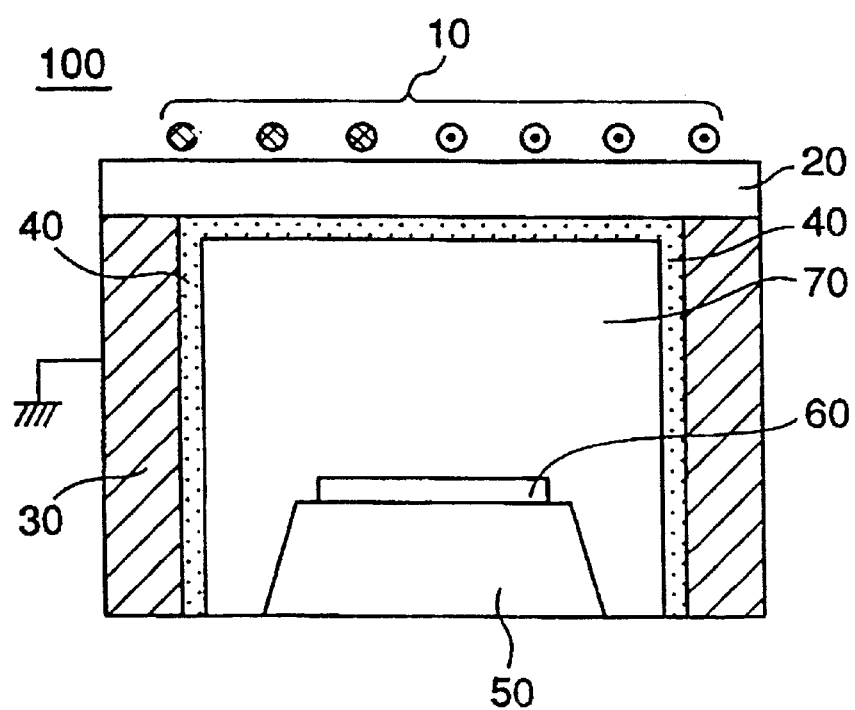
FIG. 2 is a view showing a sectional structure of the plasma treatment apparatus of FIG. 1.

FIG. 2 is a cross-sectional view showing a schematic structure of a plasma treatment apparatus to which the present invention can be applied.

A plasma treatment apparatus 100 forms a vacuum chamber therein by a side wall 30 and a TCP™ (TCP™ is a trademark of LAM Research Corporation) window 20 forming a top surface and supplies a high-frequency power to high-frequency coils 10 provided on the top of the window 20 to generate plasma in the chamber 70. The side wall 30 is usually formed of a conductive material and grounded.

The TCP™ window 20 is usually formed of a dielectric material which allows radio frequency power to be induced into the chamber 70. A pedestal 50 is located on a bottom surface of the chamber 70, and a member to be treated, e.g., a semiconductor substrate such as a wafer 60 is mounted thereon. The side wall 30 and the internal surface of the TCP™ window 20 are covered with a plasma protection material 40. This plasma protection material 40 is constituted by depositing a silicon carbide film on the surface of a sintered silicon carbide substrate.

In general, the sintered silicon carbide itself is an n-type semiconductor material and has a resistivity of approximately $10^{2-3}$ $\Omega \cdot$cm. However, in order to promote the flow of an induced electric current through the protection member, it is desirable to increase the resistivity of the silicon carbide. Accordingly, a p-type dopant impurity such as boron can be added to the silicon carbide to increase the resistivity. The doping of the boron is usually realized by adding 1 to 2% of boron nitride (BN) powder.

Such addition of boron can increase the resistivity of the sintered silicon carbide from $10^{2-3}$ $\Omega \cdot$cm to $10^{7-9}$ $\Omega \cdot$cm. However, the added boron may be possibly discharged as a contaminant from the internal surface into the chamber 70 during the plasma treatment of a substrate. In order to avoid discharging the boron added in the sintered silicon carbide into the interior of the chamber, a silicon carbide film having high purity is deposited and adhered to the surface of the sintered silicon carbide.

It is generally known that deposition of a silicon carbide film by the CVD method can form a film having extremely high purity.

When such a silicon carbide film having high purity is deposited on the surface of the sintered silicon carbide, boron contained in the sintered silicon carbide can be protected from being discharged into the reactor during the plasma treatment.

However, the resistivity of the silicon carbide film formed in this manner is not necessarily high.

If this silicon carbide film is used as the plasma protection member without any change, an eddy current can be generated in the silicon carbide film due to a high-frequency induced current, which results in the above-mentioned problem.

Figure 1:
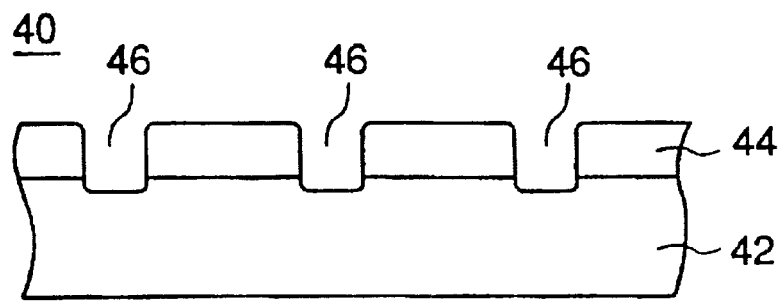
FIG. 1 is a cross-sectional view showing a structure of a plasma protection member used in a plasma treatment apparatus according to a preferred embodiment of the present invention.

FIG. 1 is a cross-sectional view showing the structure of a preferred plasma protection member according to the present invention. In particular, a CVD silicon carbide film 44 having low resistivity is deposited on the surface of the sintered silicon carbide substrate 42 whose resistivity is increased from $10^{2-3}$ Ω·cm to $10^{7-9}$ Ω·cm by addition of the boron. A protection member 40 having such a complex structure is coated on the side wall 30 and the internal surface of the TCP™ window 20.

In the present invention, filament grooves 46 are formed in the low resistivity silicon carbide film 44 in order to partition the silicon carbide film and thus prevent or minimize generation of eddy currents on the surface of the silicon carbide film 44.

With such a structure, since the silicon carbide film 44 is divided into a plurality of partitions by the filament grooves 46, eddy currents can be prevented from flowing across the wall surface. Therefore, it is possible to reduce energy loss otherwise caused by eddy currents on the surface of the protection member 40, and it is also possible to minimize changes to the plasma density distribution in the chamber.

It has been determined that a preferred silicon carbide film thickness can range from 0.5 mm to 6 mm. Further, the width of the filament groove 46 is preferably smaller than twice the ion sheath thickness of the plasma which can be formed in contact with the protection member 40.

By maintaining the width of the filament groove 46 sufficiently small, it is possible to prevent the plasma from penetrating into the groove 46 and thereby prevent the plasma from attacking the surface of the sintered silicon carbide 42 exposed at the bottom of the groove 46. As a result, the plasma can be prevented from liberating boron in the sintered silicon carbide and thereby avoid contamination of the chamber.

It is to be noted that the protection member 40 formed of the complex silicon carbide having the filament grooves according to the present invention can be used for the internal surface of an ICP window 20 as well as the internal surface of the side wall 30.

As described above, according to the present invention, the filament grooves partition the silicon carbide film so as to break any electromagnetic field caused by eddy currents on the surface of the surface of the silicon carbide film. Such an arrangement allows use of a silicon carbide substrate having a resistivity changing amount of boron therein while protecting the chamber from boron contamination. That is, the high purity, low resistivity silicon carbide film protects the chamber from boron contamination in the sintered silicon carbide substrate and the filament grooves avoid the deleterious effect caused by eddy currents on the surface of the silicon carbide film which could otherwise lead to adverse effects on the plasma density distribution in the chamber or heat generation of the chamber internal surface.

While the invention has been described in detail with reference to specific embodiments thereof, it will be apparent to those skilled in the art that various changes and modifications can be made, and equivalents employed, without departing from the scope of the appended claims.

What is claimed is:

1. A plasma treatment apparatus comprising a plasma reaction chamber having a plasma protection member forming an inner surface thereof, the protection member comprising a sintered silicon carbide substrate and a silicon carbide film thereon, the silicon carbide film including at least one filament groove therein.

2. The plasma treatment apparatus according to claim 1, wherein a width of the filament groove is smaller than twice an ion sheath thickness of plasma which can be generated in the plasma chamber.

3. The plasma treatment apparatus according to claim 1, wherein a thickness of the silicon carbide film is in a range of 0.5 mm to 6 mm.

4. The plasma treatment apparatus according to claim 1, wherein the sintered silicon carbide includes an additive in an amount sufficient to increase resistivity thereof to a value at least twice that of the silicon carbide film.

5. The plasma treatment apparatus according to claim 4, wherein the additive comprises boron in an amount sufficient to increase the resistivity of the sintered silicon carbide to a range of $10^{2-3}$ Ω·cm to $10^{7-9}$ Ω·cm.

6. The plasma treatment apparatus according to claim 1, wherein the plasma chamber includes a gas supply, an antenna and a dielectric window, the gas supply supplying process gas into the plasma chamber and the antenna passing radio frequency energy through the dielectric window and into the plasma chamber to energize the process gas into a plasma state.

7. The plasma treatment apparatus according to claim 1, wherein the protection member covers an inner surface of a sidewall of the plasma chamber.

8. The plasma treatment apparatus according to claim 1, wherein the protection member covers an inner surface of a top wall of the plasma chamber.

9. The plasma treatment apparatus according to claim 1, wherein the at least one filament groove extends through the silicon carbide film and into the sintered silicon carbide substrate.

10. The plasma treatment apparatus according to claim 9, wherein the at least one filament groove separates the silicon carbide film into a plurality of discrete sections.

11. A method of processing a semiconductor substrate in a plasma treatment apparatus comprising a plasma reaction chamber having a plasma protection member forming an inner surface thereof, the protection member comprising a sintered silicon carbide substrate and a silicon carbide film thereon, the silicon carbide film including at least one filament groove therein, the method including generating a plasma in the chamber and processing a semiconductor substrate in the chamber without discharging a contaminant from the sintered silicon carbide substrate.

12. The method according to claim 11, wherein a width of the filament groove is smaller than twice an ion sheath thickness of the plasma generated in the plasma chamber, the filament groove being effective to minimize generation of eddy currents on the surface of the silicon carbide film and/or prevent the plasma from penetrating into the filament groove.

13. The method according to claim 11, wherein the at least one filament groove comprises a plurality of filament grooves and a thickness of the silicon carbide film is in a range of 0.5 mm to 6 mm, the filament grooves partitioning the silicon carbide film into a plurality of sections such that eddy currents can be prevented from flowing across an inner wall surface of the chamber.

14. The method according to claim 11, wherein the sintered silicon carbide includes an additive in an amount sufficient to increase resistivity thereof to a value at least twice that of the silicon carbide film.

15. The method according to claim 14, wherein the additive comprises boron in an amount sufficient to increase the resistivity of the sintered silicon carbide to about $10^{7-9}$ $\Omega\cdot$cm, the plasma protection member comprising a window and the plasma being generated by passing radio frequency power through the window.

16. The method according to claim 11, wherein the plasma chamber includes a gas supply, an antenna and a dielectric window, the gas supply supplying process gas into the plasma chamber and the antenna passing radio frequency energy through the dielectric window and into the plasma chamber to energize the process gas into a plasma state, the plasma protection member comprising an inner surface of the dielectric window.

17. The method according to claim 11, wherein the plasma protection member covers an inner surface of a sidewall of the plasma chamber, the filament groove being effective to minimize changes to plasma density distribution in the chamber.

18. The method according to claim 11, wherein the plasma protection member comprises a first liner covering an inner surface of a top wall of the plasma chamber and a second liner covering an inner sidewall of the chamber, the semiconductor substrate comprising a silicon wafer supported on a pedestal in the chamber.

19. The method according to claim 11, wherein the at least one filament groove comprises a plurality of filament grooves which extend completely through the silicon carbide film and into the sintered silicon carbide substrate, the silicon carbide film having a resistivity which is at least two times lower than that of the sintered silicon carbide substrate.

20. The method according to claim 19, wherein the at least one filament groove separates the silicon carbide film into a plurality of discrete sections, the plasma being generated by an antenna which passes radio frequency power into the chamber.

* * * * *